(12) United States Patent
Albert et al.

(10) Patent No.: US 10,295,063 B2
(45) Date of Patent: May 21, 2019

(54) WAFER TREATING DEVICE AND SEALING RING FOR A WAFER TREATING DEVICE

(71) Applicant: SUSS MicroTec Lithography GmbH, Garching (DE)

(72) Inventors: Dieter Albert, Karlsruhe (DE); Michael Braun, Wurmberg-Neubaerental (DE)

(73) Assignee: SUSS MICROTEC LITHOGRAPHY GMBH, Garching (DE)

( * ) Notice: Subject to any disclaimer, the term of this patent is extended or adjusted under 35 U.S.C. 154(b) by 129 days.

(21) Appl. No.: 15/064,716

(22) Filed: Mar. 9, 2016

(65) Prior Publication Data

US 2016/0300751 A1 Oct. 13, 2016

(30) Foreign Application Priority Data

Apr. 13, 2015 (NL) ...................................... 2014625

(51) Int. Cl.
*H01L 21/67* (2006.01)
*H01L 21/687* (2006.01)
*F16J 15/3252* (2016.01)
*F16J 15/3268* (2016.01)
*F16J 15/3228* (2016.01)
*F16J 15/3276* (2016.01)

(52) U.S. Cl.
CPC ....... *F16J 15/3252* (2013.01); *F16J 15/3228* (2013.01); *F16J 15/3268* (2013.01); *F16J 15/3276* (2013.01); *H01L 21/67126* (2013.01); *H01L 21/68735* (2013.01)

(58) Field of Classification Search
CPC .......... H01L 21/67051; H01L 21/6708; H01L 21/67126; H01L 21/68721
See application file for complete search history.

(56) References Cited

U.S. PATENT DOCUMENTS

| | | | | |
|---|---|---|---|---|
| 5,421,401 A | * | 6/1995 | Sherstinsky | ............ C23C 14/50 118/728 |
| 5,447,615 A | * | 9/1995 | Ishida | ..................... C25D 17/06 204/224 R |
| 5,660,699 A | * | 8/1997 | Saito | ...................... C25D 17/06 204/297.03 |
| 5,948,204 A | * | 9/1999 | Maveety | ................. B24B 37/30 156/345.14 |
| 6,248,222 B1 | * | 6/2001 | Wang | ........................ C25F 7/00 204/297.01 |
| 6,569,302 B1 | * | 5/2003 | Steinrucke | ........ H01L 21/67126 204/286.1 |
| 6,673,218 B2 | * | 1/2004 | Yamamoto | ............. C25D 17/06 204/286.1 |
| 7,288,489 B2 | * | 10/2007 | Dolechek | ............ H01L 21/6835 216/11 |
| 7,901,551 B2 | * | 3/2011 | Yoshioka | ............... C25D 17/06 204/297.01 |

(Continued)

FOREIGN PATENT DOCUMENTS

DE 102013105136 A1 11/2013
DE 102016101795 A1 8/2016

(Continued)

*Primary Examiner* — Tyrone V Hall, Jr.
(74) *Attorney, Agent, or Firm* — Hayes Soloway PC

(57) ABSTRACT

A sealing ring for attaching to a cover ring of a wafer treating device has an annular carrier and a sealing lip which is releasably attached to the carrier.

9 Claims, 7 Drawing Sheets

(56) References Cited

U.S. PATENT DOCUMENTS

| | | | |
|---|---|---|---|
| 7,905,994 B2* | 3/2011 | Dubin | C25D 17/06 |
| | | | 204/297.01 |
| 8,536,020 B2* | 9/2013 | Thallner | H01L 21/67092 |
| | | | 156/349 |
| 10,087,543 B2 | 10/2018 | Zimmerman et al. | |
| 10,184,564 B2 | 1/2019 | Balsells et al. | |
| 2003/0008602 A1* | 1/2003 | Ashjaee | B24B 37/30 |
| | | | 451/54 |
| 2006/0185695 A1* | 8/2006 | Kato | H01L 21/67051 |
| | | | 134/33 |
| 2006/0272561 A1 | 12/2006 | Chang et al. | |
| 2007/0075503 A1 | 4/2007 | Hayashi et al. | |
| 2008/0298936 A1* | 12/2008 | van der Meulen | |
| | | | H01L 21/67126 |
| | | | 414/217.1 |
| 2009/0305617 A1* | 12/2009 | Nakamura | H01L 21/6838 |
| | | | 451/364 |
| 2010/0000858 A1 | 1/2010 | Yoshioka et al. | |
| 2016/0064267 A1* | 3/2016 | Toh | H01L 21/68757 |
| | | | 156/345.48 |
| 2016/0300751 A1* | 10/2016 | Albert | F16J 15/3268 |

FOREIGN PATENT DOCUMENTS

| | | |
|---|---|---|
| JP | H11-162900 A | 6/1999 |
| JP | 2006-332530 A | 12/2006 |

\* cited by examiner

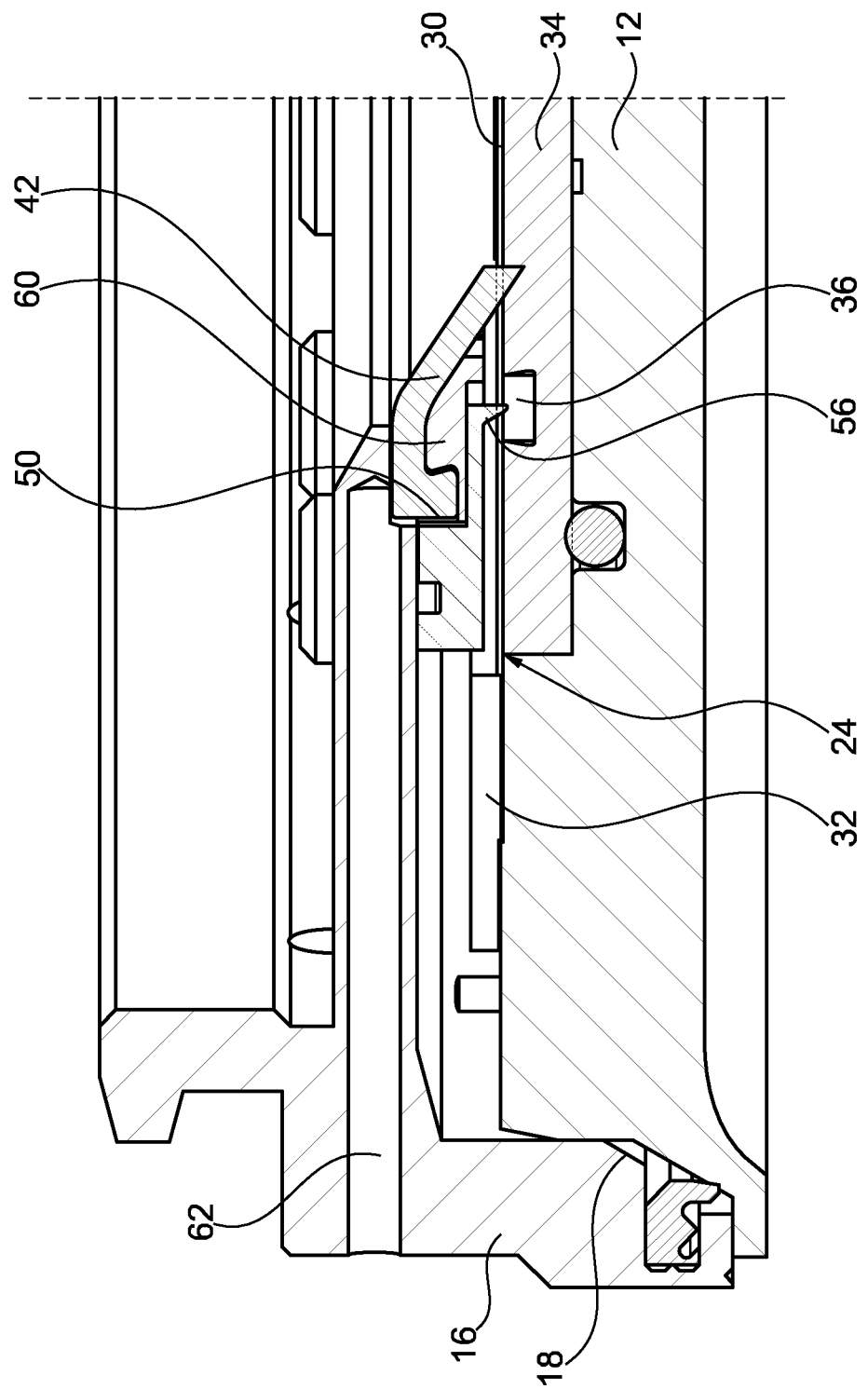

WAFER TREATING DEVICE AND SEALING RING FOR A WAFER TREATING DEVICE

The invention relates to a sealing ring for attaching to a cover ring of a wafer treating device. The invention further relates to a wafer treating device having a receptacle for a wafer, a cover ring placed onto the receptacle, and a sealing ring. Finally, the invention relates to a method for producing a sealing ring.

BACKGROUND OF THE INVENTION

For the treatment of wafers, treating devices are known in which the wafer can be treated with a liquid. Owing to the treatment, the wafer can either be modified or processed as such or the liquid can be used to clean the surface of the wafer.

The liquid applied to treat the wafer must then be removed when the treatment step has been concluded. For this purpose, the receptacle, together with the wafer, can be rotated an that the liquid is discharged to the outside via a cover ring under the effect of centrifugal force.

In order to fix the wafer in the wafer treating device, a vacuum is being used. In addition, a cover ring is provided which by means of a seal engages with the edge region of the wafer or with a component on which the wafer is temporarily fixed, e.g., on a carrier film which in turn is held by a frame. In order to fix the cover ring to the wafer or carrier film, a vacuum chamber is provided between the cover ring and the receptacle so that a pressing force can be generated when a vacuum is being applied to the vacuum chamber.

The object of the invention is to ensure a reliable sealing between the wafer and the cover ring an that, in particular, no liquid whatsoever can enter the vacuum chamber, or enter regions of the wafer which are not to be treated, or enter the region in which the frame of the carrier film is received.

BRIEF DESCRIPTION OF THE INVENTION

This object is achieved in accordance with the invention in that a sealing ring is provided for attaching to a cover ring of a wafer treating device, having an annular carrier and a sealing lip which is releasably attached to the carrier. In order to achieve the above-mentioned object, there is provided a wafer treating device having a receptacle for a wafer, a cover ring placed onto the receptacle, and a sealing ring of the previously mentioned type, by means of which a wafer can be sealed on the receptacle. Finally, in order to achieve the above-mentioned object, a method for producing a sealing ring is provided, comprising the following steps: initially, an annular carrier is provided which is provided on its upper side with a groove and a bearing surface which slopes radially inwardly from the upper side. Furthermore, a sealing lip is provided which is provided with a bead, wherein the diameter of the bead and preferably of the entire sealing lip in the initial state of the sealing lip is smaller than the diameter of the groove or that of the annular carrier. The sealing lip is fitted in the groove so that it extends along the bearing surface of the carrier and its free end extends beyond the lower side of the carrier.

The invention is based on the principle of using a two-part seal consisting of the carrier and the sealing lip in order to provide a seal between the cover ring and the wafer. The carrier ensures that the sealing lip is supported across a large area so that it has the desired shape. A further advantage resides in the fact that the sealing lip is replaceable, whereby it can be replaced with low effort if it is worn out or is to be adapted to a different application.

Preferably, provision is made that the sealing lip is fitted in a groove in the carrier. This produces an efficient seal between the carrier and the sealing lip.

Preferably, the sealing lip is provided with a bead on the side lying radially outwardly, said bead being fitted in the groove. The bead allows the sealing lip to be attached to the carrier in a self-retaining manner, in particular when the bead has a diameter which is slightly smaller than the diameter of the groove.

Preferably, provision is made that the sealing lip extends starting from the groove over a part of the upper side of the carrier and over a conical bearing surface until the free end thereof protrudes beyond the lower side of the carrier. In this embodiment, the free end of the seal is applied to the surface of the wafer or the carrier film by means of its resilient biasing force, so that it reliably provides a seal at that location. The seal is not mechanically pressed against the wafer or the carrier film but rather is pressed onto the wafer only by the bias produced by clamping, so that undesirably high contact forces cannot occur.

Preferably, provision is made that the space between the bearing surface of the carrier and the sealing lip is vented to a point on the upper side of the carrier outside the sealing lip by means of a channel. The channel ensures that liquid, which passes "behind" the seal despite the contact between the sealing lip and the wafer or the carrier film, can be reliably discharged from there.

In accordance with one embodiment of the invention, provision is made that the carrier is provided with a seal which can lie against the cover ring. The seal ensures a reliable seal between the annular carrier and the cover ring of the wafer treating device and thus permits the formation of the vacuum chamber.

Preferably, provision is made that the cover ring is provided with a venting channel which is open to a bearing surface for the sealing ring on the cover ring. The venting channel allows the portion of the liquid which was discharged through the channel between the bearing surface of the carrier and the sealing lip to be discharged.

Preferably, provision is made that the carrier is screwed to the cover ring. This allows the seal to be detached from the cover ring with little effort in order to replace the sealing lip, for example.

In accordance with a preferred embodiment of the invention, provision is made that the sealing lip is cut to size after being mounted on the carrier or even after being mounted on the cover ring. This allows all tolerance-induced size alterations of the sealing lip to be "cut off" after assembly so that in particular the edge of the sealing lip associated with the wafer meets the specifications extremely precisely. A further advantage resides in the fact that by way of the cutting process the sealing lip can be customised with low effort without a new, expensive casting mould having to be produced therefor.

Preferably, provision is made that the free end of the sealing lip is out such that the end face of the sealing lip facing away from the carrier extends perpendicularly with respect to the upper side of the carrier or as a cone which widens towards the top. This produces, when the sealing lip lies against the wafer, an annular contact region which has a small width and is determined extremely precisely. Furthermore, when the sealing lip lies against the wafer, the end face is slightly deformed so that the liquid can efficiently flow outwards via the end face of the sealing lip under the effect of centrifugal force.

BRIEF DESCRIPTION OF THE DRAWINGS

The invention will be described hereinafter with the aid of an embodiment which is illustrated in the attached drawings, in which:

FIG. 3 shows the detail X of FIG. 1 in a sectional plane which is slightly offset compared with the illustration of FIG. 2;

DETAILED DESCRIPTION OF THE INVENTION

Figure 1:
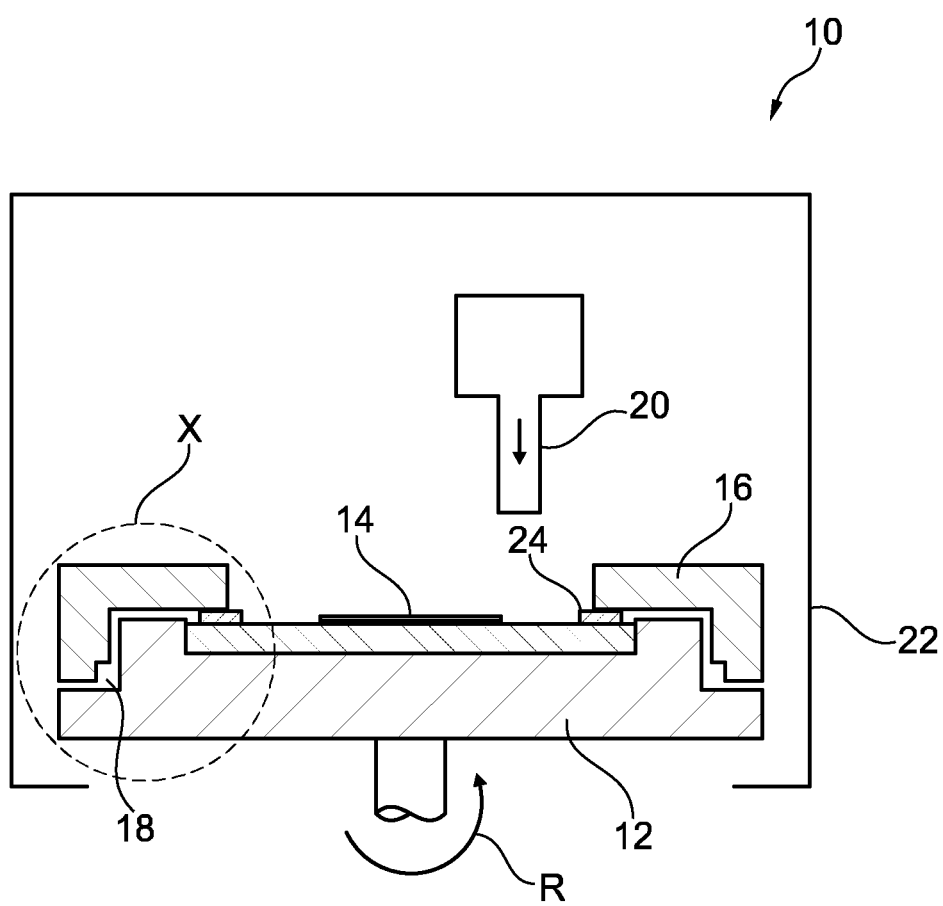
FIG. 1 schematically shows a wafer treating device.

FIG. 1 schematically shows a wafer treating device 10 in which a wafer can be treated with a liquid.

The wafer treating device 10 comprises a receptacle 12 in which a wafer 14 can be arranged. The wafer itself or a carrier film ("tape") on which the wafer 14 is fixed can be sealed to the receptacle 12 by means of a schematically illustrated cover ring 16. The cover ring 16 can be loaded against the wafer or against the carrier film by applying a vacuum to a vacuum chamber 18.

A liquid can be applied to the wafer 14 by means of a metering device 20 which is illustrated schematically in this figure. The liquid can be used, for example, to chemically or physically process the surface of the wafer. The liquid can also be used to clean the surface of the wafer.

In order to be able to subsequently remove the liquid from the wafer 14, the receptacle 12 can be rotated (indicated by the arrow R) so that the liquid is centrifuged outwards under the effect of centrifugal force. It is then collected in a schematically indicated housing 22.

In order to prevent the liquid from entering the region beneath the cover ring 16, a sealing ring 24 is provided which provides a seal between the surface of the wafer 14 and the cover ring 16.

Figure 2:
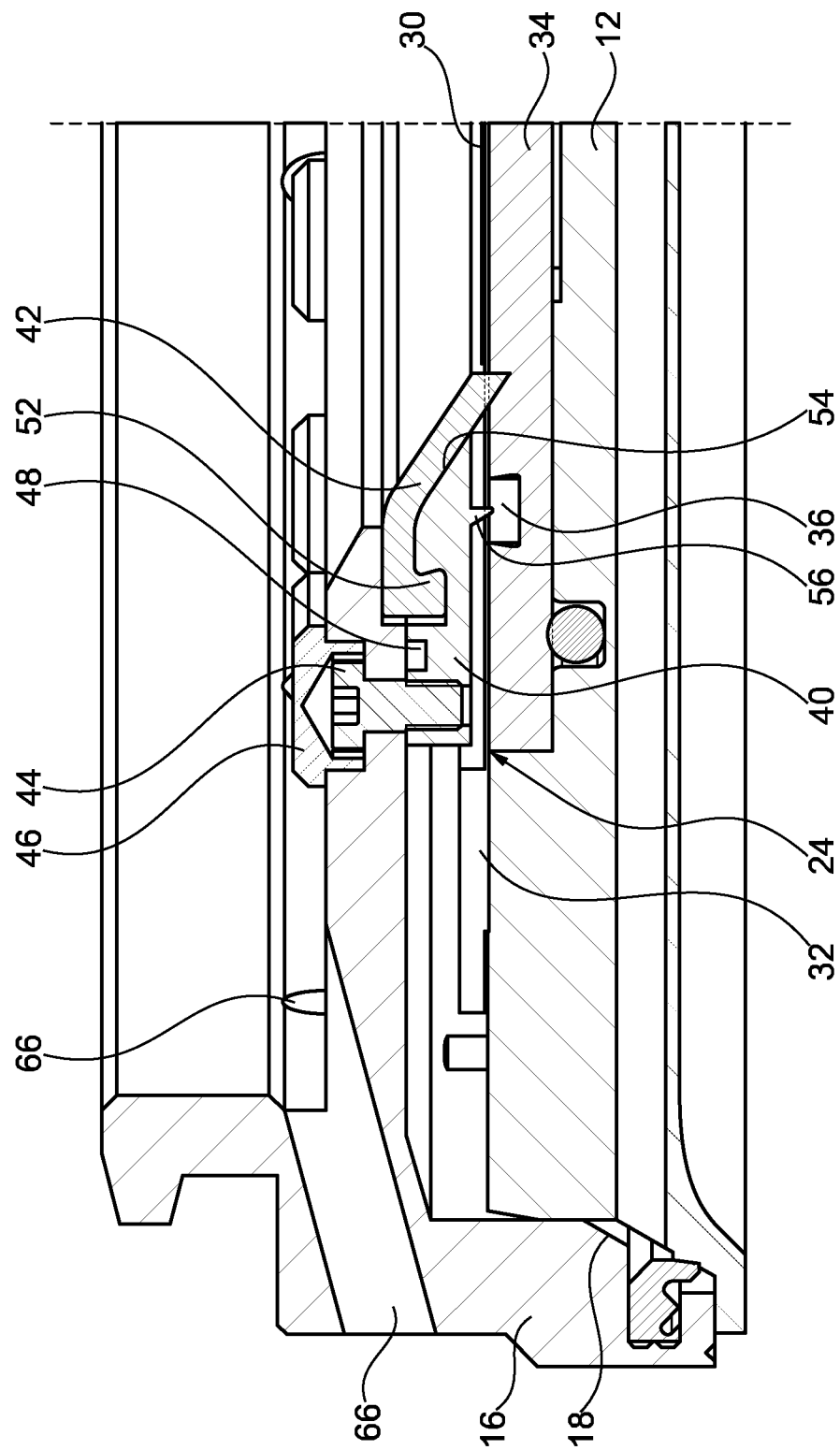
FIG. 2 shows an enlarged view of the detail X of FIG. 1.

The seal between the surface of the wafer 14, or a carrier film on which the wafer 14 is arranged, and the cover ring 16 will be explained in detail hereinafter with the aid of FIGS. 2 and 3.

The wafer (not visible in FIGS. 2 and 3) is attached to a carrier film 30 (also referred to as "tape") for improved handling capability, said carrier film being held tightly in a frame 32. The carrier film 30 lies with a majority of its surface on a pad 34 in which an annular sealing insert 36 is provided.

The sealing ring 24 consisting of a carrier 40 and a sealing lip 42 attached thereto is provided in order to provide a seal between the wafer 14 and the cover ring 16, or to be more precise a seal between the carrier film 30, bearing the wafer 14, and the cover ring 16.

The carrier 40 is releasably attached to the cover ring 16 by means of a plurality of screws 44. Each screw head of the screws 44 is covered by means of a covering 46. This prevents liquid from remaining in the region of the screw heads.

The carrier 40 is provided with a seal 48 on its upper side, i.e., the side lying against the cover ring 16, wherein said seal can be designed in a similar manner to an O-ring and provides a seal between the carrier 40 and the cover ring 16.

Figure 4A:
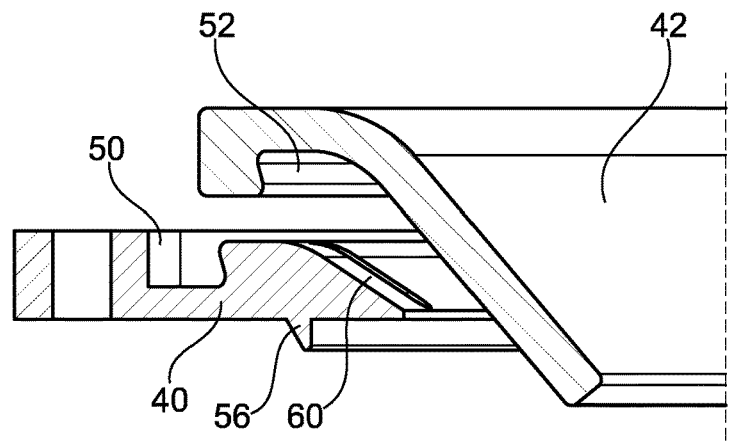
FIGS. 4a to 4c schematically show different steps when producing the sealing ring.

The carrier 40 is provided with a circumferential groove 50 (see also FIG. 4a) radially inside the seal 48, the sealing lip 42 being releasably inserted into the groove. For this purpose, the sealing lip 42 is provided with a bead 52 on its radially outer-lying edge.

The carrier 40 is provided with a conical bearing surface 54 radially inside the groove 50, the sealing lip lying against the bearing surface. The sealing lip 42 thus extends from the groove 50 of the carrier along the bearing surface 54 radially inwards until it protrudes beyond the lower side of the carrier 40 towards the wafer 14 or carrier film 30.

The lower side of the carrier 40 is provided with a pressing rib 56 which lies opposite the sealing insert 36 and presses the carrier film 30 against the sealing insert 36 so that a seal is provided at that location.

The carrier 40 is provided with a plurality of channels 60 (see FIGS. 3 and 4a) which extend beneath the sealing lip 42 into the groove 50. The channels 60 are guided in the manner of slots downwards to immediately in front of the pressing rib 56 (see FIG. 3).

The channels 60 are used to divert liquid into the groove 50, which liquid enters, below the sealing lip 42, the space between the sealing lip 42 and pressing rib 56. This liquid is discharged from the groove 50 via a venting channel 62 (see FIG. 3) which is formed in the cover ring 16 in the (at least approximately) radial direction.

Figure 4B:
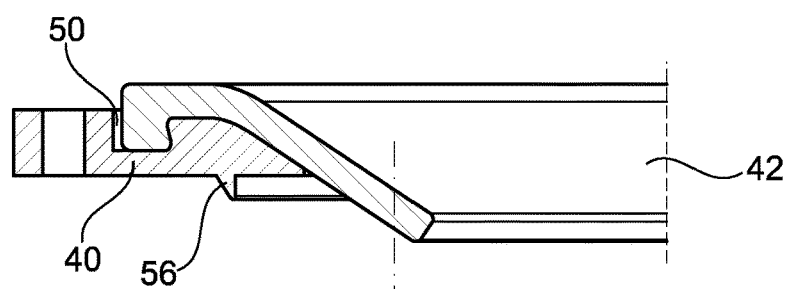

The sealing ring 24 is produced by virtue of the fact that a separately produced sealing lip 42 (see FIG. 4a) is engaged with the groove 50 of the carrier 40. The bead 52 of the sealing lip 42 is dimensioned such that it has a smaller diameter than the groove 50. The sealing lip 42 is hereby engaged into the carrier 40 in a resiliently based condition (see the state illustrated in FIG. 4b).

Figure 4C:
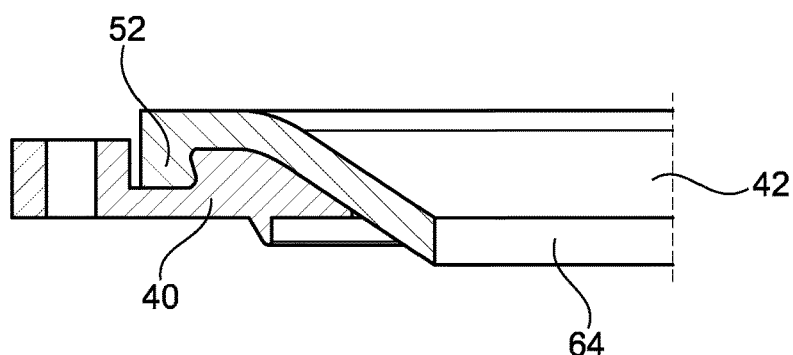
Figure 5:
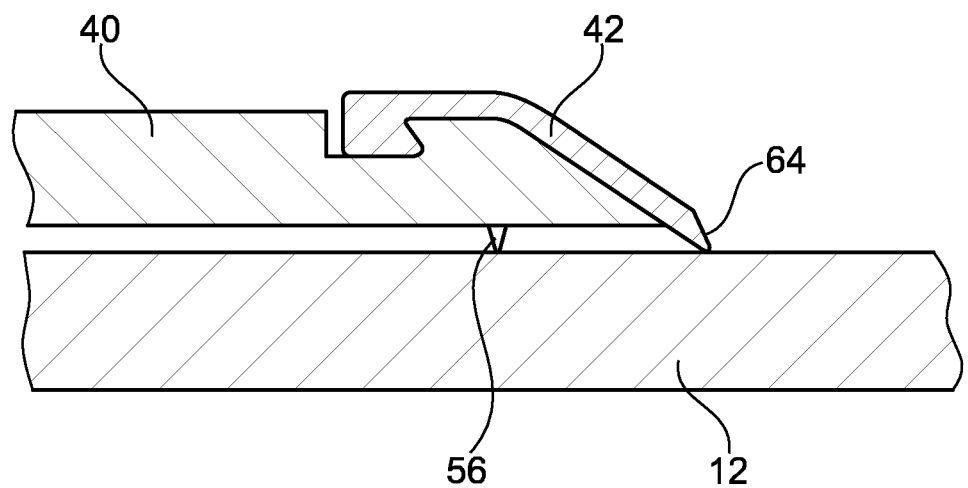
FIG. 5 schematically shows the contact between the sealing lip and the wafer.

In a next step, the radially inner-lying edge of the sealing lip 42 is cut (see the schematically indicated section S) so that the contour of the sealing lip 42 illustrated in FIG. 4c is maintained at the radially inner-lying edge. This contour is characterised in that the inner-lying end face 64 extends approximately perpendicularly with respect to the upper side and also to the lower side of the carrier 40, or conically, opening at the top.

Irrespective of the contour of the inner-lying end face 64, a particularly high level of dimensional accuracy can be ensured by cutting the sealing lip 42 after it has been attached to the carrier 40. The tolerances which occur when producing the sealing lip 42 as such are comparatively high. By cutting the sealing lip in the completely mounted state, all inaccuracies caused by production are "simply cut off". Furthermore, different sealing lips 42 corresponding to customer-specific requirements can be cut from one and the same sealing lip blank, without a new mould having to be provided each time for producing a suitable sealing lip.

In operation, the cover ring 16 is loaded against the wafer or against the carrier film 30 by applying a vacuum to the vacuum chamber 18. The sealing lip 42 is applied with its radially inner-lying end onto the wafer or onto the carrier film 30. The sealing lip 42 is slightly resiliently deformed, producing the desired pressing forces on the carrier film 30.

Owing to the specific cutting of the inner-lying edge of the sealing lip 42, a linear contact (in theory) is produced, resulting in a comparatively high contact force. Furthermore, the end wall 64 of the sealing lip, which after cutting is oriented perpendicularly with respect to the upper side of the carrier 40 or in the manner of an upwardly widening cone, is slightly deformed so that an outwardly widening cone is formed.

The sealing lip 42 is a first seal between the cover ring 16 and the wafer 14 or the carrier film 30 (and thus also between the carrier 40 and the carrier film 30).

Further contact between the cover ring 16 and the wafer 14 or the carrier film 30 is produced by the pressing rib 56. This presses the carrier film 30 in the region of the sealing insert 36. The resiliency of the sealing insert 36 prevents the pressing rib 56 exerting unduly high clamping forces on the carrier film 30.

The pressing rib 56 is a second seal between the cover ring 16 and the wafer 14 or the carrier film 30.

When, during operation of the wafer treating device, a used liquid is to be removed from the wafer 14, the receptacle 12 is rotated. Rotational speeds of, for example, up to 1500 rpm are suitable. The liquid located on the wafer or carrier film 30 flows outwardly under the effect of the centrifugal force so that it is discharged radially outwards via the end face 64, the sealing lip 42 and the section of the cover ring 16 connected thereabove. The liquid can then leave the cover ring 16 through an outlet 66 (see FIG. 2).

If liquid passes radially beneath the sealing lip 42 in the region of the contact location between the sealing lip 42 and the carrier film 30, it enters the space between the sealing lip and the pressure rib 56. It is discharged from this space through the channels 60 and the groove 50 to the venting channel 62. This is assisted in that owing to the radial orientation of the venting channels 62, a vacuum is produced at that location above a rotational speed of approximately 500 rpm.

The channels 60 ensure that no liquid whatsoever remains in front of the pressing rib 56, which liquid could possibly corrode the carrier film 30 in the case of prolonged contact. Furthermore, it is ensured that no liquid whatsoever can enter the region in which the frame 32 is arranged.

Figure 6:
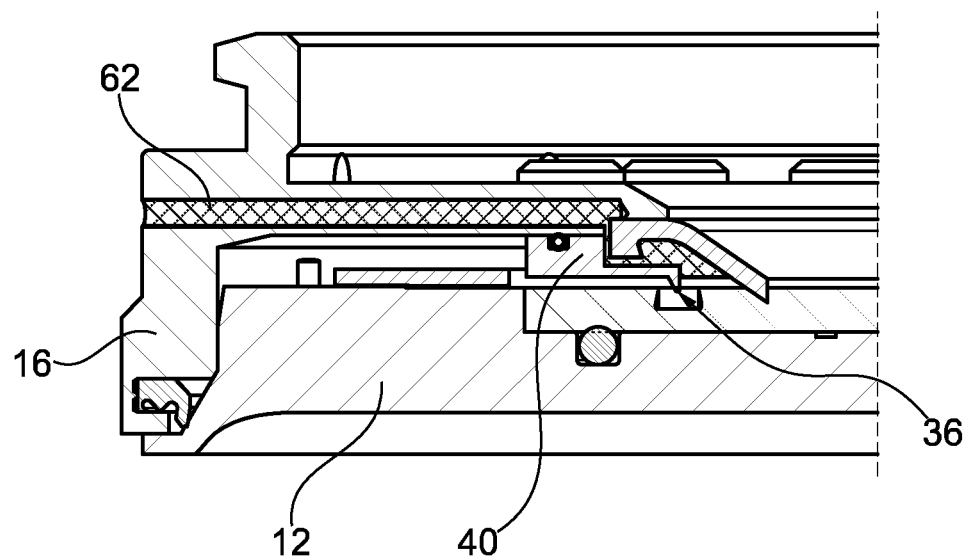
FIG. 6 shows a schematic view of the liquid p h of a second sealing stage.

The described two-stage sealing system reliably prevents liquid from entering a region outside the sealing ring 24. In the first sealing stage, a majority of the liquid is diverted by means of the sealing lip 42. Liquid which can pass "behind" the sealing lip 42 then accumulates at the second seal (the pressing rib 56), from where it is discharged by means of the channels 60. This can be seen clearly in FIG. 6 in which the region in which the liquid is located, which liquid passes behind the first seal, is marked with crosses.

Figure 7:
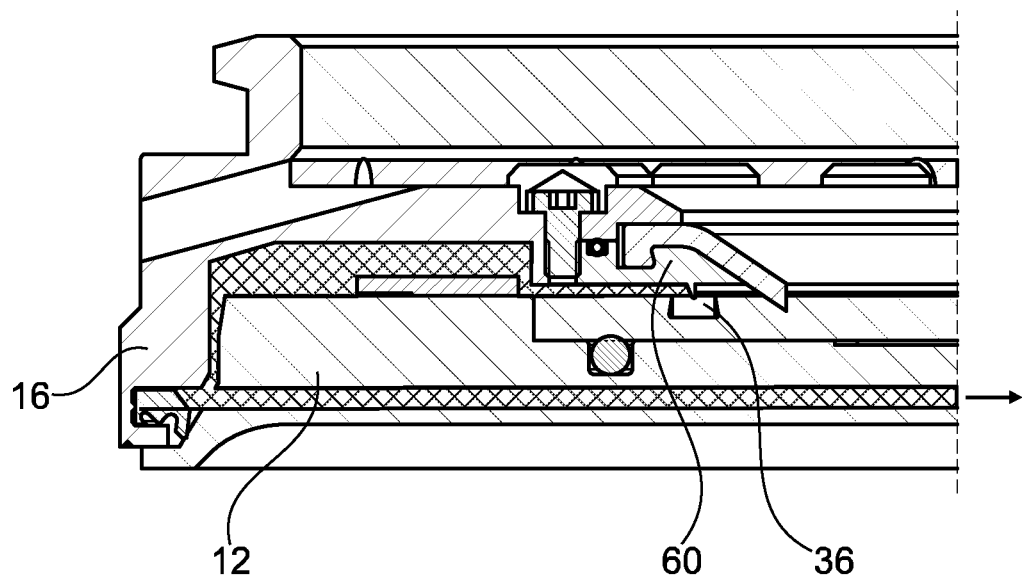
FIG. 7 schematically shows the active area of a vacuum applied between the cover ring 16 and receptacle 12.

In FIG. 7, the entire vacuum chamber 18 is marked with cross-hatched, i.e., the region which can be used to produce the desired pressing force between the cover ring 16 and receptacle 12. It can be seen that the vacuum chamber 18 extends over an extremely large surface from the outer periphery of the receptacle 12 to the pressing rib 56. Owing to the two-stage sealing system, liquid is reliably prevented from entering the vacuum chamber 18.

The invention claimed is:

1. A sealing ring for attaching to a cover ring of a wafer treating device, the sealing ring comprising:
    an annular carrier having a groove and an annular carrier opening;
    a sealing lip releasably attached to said carrier, wherein said sealing lip is fitted into said groove in said carrier; and
    wherein said sealing lip extends from said groove, over a part of an upper side of said carrier, and over a conical bearing surface, and into the annular carrier opening until a free end of said sealing lip protrudes beyond a lower side of said carrier.

2. The sealing ring of claim 1 wherein said sealing lip is provided with a bead on a side lying radially outwardly, said bead being fitted into said groove.

3. The sealing ring of claim 1 wherein a space between said bearing surface of said carrier and said sealing lip is vented to a point on an upper side of said carrier outside said sealing lip by means of a channel.

4. The sealing ring of claim 1 wherein said carrier is provided with a pressing rib which lies radially outside a free end of said sealing lip.

5. The sealing ring of claim 1 wherein said carrier is provided with a seal which can lie against said cover ring.

6. A wafer treating device having a receptacle for a wafer, having a cover ring placed onto the receptacle, and having a sealing ring with an annular carrier having a groove and an annular carrier opening, a sealing lip releasably attached to said carrier, said sealing ring being adapted for sealing a wafer on said receptacle, and wherein said cover ring is provided with a venting channel which is open to a bearing surface for said sealing ring on said cover ring.

7. The wafer treating of claim 6 wherein said carrier is screwed to said cover ring.

8. The wafer treating device of claim 6 wherein a vacuum chamber is sealed between said cover ring, said receptacle and said carrier.

9. A sealing ring for attaching to a cover ring of a wafer treating device, having an annular carrier having a groove and an annular carrier opening, a sealing lip which is releasably attached to said carrier, wherein a space between a bearing surface of said carrier and said sealing lip is vented to a point on an upper side of said carrier outside said sealing lip by means of a channel.

\* \* \* \* \*